United States Patent Office 3,128,538

Patented Apr. 14, 1964

3,128,538

SEMICONDUCTOR-METAL BONDING METHOD

Horst Kutschera, Hamburg-Langenhorn, Germany, assignor to North American Philips Company, Inc., New York, N.Y., a corporation of Delaware No Drawing. Filed Feb. 6, 1961, Ser. No. 87,063
Claims priority, application Germany Mar. 11, 1960
4 Claims. (Cl. 29—155.5)

The invention relates to a method of wetting and joining semi-conductors and metals.

In the production of semi-conductor devices it is known to alloy metals into the semi-conductor crystal. In such alloying, the metal is first provided on the semi-conductor crystal. The assembly is then heated to such a high temperature that the metal melts, wets the semi-conductor crystal and alloys into it.

However, this method has the drawback that, probably owing to its surface tension, the melting metal contracts to a ball on the crystal surface and consequently at first wets only a limited surface area. Then the metal extends on the crystal surface. Uneven, for example hemispherical, alloying zones are the result. In addition, completely unwetted areas within the wetted surface are retained also.

It is desirable that the alloying zones extend in the crystal as even surfaces and that the transition from the alloying zone to the unalloyed crystal zone is an even surface. For that purpose, an even wetting of the crystal surface is required.

A partial improvement of the wetting is obtained by adding a flux. Then, already approximately flat areas are formed. These flat areas also, however, are still uneven and do not meet the requirements.

According to the invention, an even wetting and joining of semi-conductors and metals is carried out by means of a method which is characterised in that the areas to be wetted and joined are provided with an oxide of a metal or a semi-conductor and the assembly is heated in a reducing atmosphere to the reduction of the oxide, after which the substances are wetted and joined by means of the reduced material in its highly reactive condition immediately following the reduction.

The invention is based on the recognition that metal and semi-conductor oxide, for example germanium dioxide, lead oxide or indium oxide, are reduced when heated in a hydrogen-containing atmosphere. Atomic material is formed which, right after the reduction, is highly reactive. During the reduction the material sublimes, in which its comes in contact with the surface of the substances to be treated, between which it is enclosed, and penetrates into them. Other oxides also, such as bismuth oxide, nickel oxide or cadmium oxide, may advantageously be used.

It has appeared that, as a result of the high reactivity of reduced metal- and semi-conductor oxides, a "bridge" is provided between the substances to be wetted, because the highly reactive atoms act upon both substances. The surface tension of the metal and the semi-conductor respecitvely when using the method according to the invention has no influence any more on the wetting.

It has appeared that the method is particularly suitable for wetting a germanium crystal with lead. The reduction of the germanium dioxide takes place by heating in an inert gas with the addition of hydrogen at temperatures above 650° C. to below the melting temperature of the germanium.

The method according to the invention is also suitable for wetting semi-conductor crystals with indium, for which purpose indium oxide is used.

The method is also suitable for soldering semi-conductors with metals which may be alloyed with the semi-conductors. For example, nickel may be soldered on a germanium crystal using germanium dioxide without the soldering medium, germanium being melted. Physically, the soldering process may be explained in the same manner as with the wetting namely that the highly reactive germanium atoms act upon the germanium of the crystal and upon the nickel and join the lattices.

In addition, also semi-conductor crystals are soldered with graphite according to the method of the invention. In this case lead oxide is used as the soldering medium.

However, the semi-conductor oxide may also be used directly as non-melting soldering medium between two metals. For example, nickel is advantageously soldered to nickel by means of the method according to the invention.

In all the uses of the method according to the invention, it should be ensured that the surfaces to be treated are small. Otherwise, the reducing hydrogen would be prevented from coming into contact with all the parts of the germanium dioxide. The internal areas will remain unwetted which will result in uneven alloys and incomplete solderings.

In order that the invention may be readily carried into effect, it will now be described in greater detail with reference to the following examples.

*Example 1*

A layer of powdered germanium dioxide is provided on a surface of a germanium plate to be wetted. Lead is provided on the layer of germanium dioxide. The assembly is heated in an inert gas with an addition of hydrogen at 750° C. The germanium dioxide is reduced. At the same time it sublimes and comes in contact with the surfaces of the germanium crystal and of the lead. Then the lead wets the germanium crystal evenly. Even and flat transition areas are formed between the alloying zone and the unalloyed crystal.

*Example 2*

Pulverised $In_2O_3$ is mixed with pulverised $Al_2O_3$. The mixture contains a high percentage of $In_2O_3$. A germanium crystal is embedded in this mixture. The assembly is heated at 750° C. in a hydrogen-containing atmosphere. The $Al_2O_3$ does not change, but the indium is reduced, sublimes and precipitates on the crystal.

A liquid indium layer is formed on the germanium crystals, from which layer indium partially diffuses into the crystal. When cooling the assembly, the liquid indium contracts on the surface of the crystal to form balls. As a result of this, the germanium crystal obtains a p-conductive layer which forms a very flat and even transition zone with the non-alloyed part of the crystal.

*Example 3*

Pulverised $In_2O_3$ is mixed with pulversied $Al_2O_3$. The mixture contains a low percentage of $In_2O_3$. A germanium crystal is embedded in this mixture. The assembly is heated at 750° C. in an atmosphere containing hydrogen. The $Al_2O_3$ is not changed. The $In_2O_3$ is reduced, in which the atomic indium sublimes and precipitates on the crystal.

A filmy indium layer is formed on the germanium crystal which diffuses into the crystal by prolonged heating. The germanium crystal as a result obtains a p-conductive layer which forms a very flat and even transition zone with the non-alloyed part of the crystal.

*Example 4*

A layer of germanium dixoide powder is provided on a germanium plate. A nickel plate is provided on the germanium dioxide. The assembly is then heated at 750° C. in an inert gas with the addition of hydrogen. The pure germanium formed by reduction joins the germanium plate satisfactorily to the nickel plate.

*Example 5*

Germanium dioxide powder is provided on a graphite body. This assembly is heated at 700° C. in hydrogen-containing atmosphere. The reduced germanium precipitates as a layer on the graphite body. After cooling the graphite body with the germanium layer, lead oxide powder is provided on this layer. A germanium crystal is provided on the lead oxide powder. This assembly is again heated at 700° C. in the hydrogen-containing atmosphere. A very rigid joint is formed between the graphite and the germanium.

*Example 6*

Lead oxide powder and a glass plate are provided on a germanium plate. The assembly is heated at 700° C. in a hydrogen atmosphere. The lead obtained by reduction melts and joins, as the soldering medium, the germanium and the glass.

*Example 7*

Germanium dioxide powder is provided on a nickel plate. Another nickel plate is provided on this powder. The assembly is heated at 700° C. in a hydrogen atmosphere. The germanium dioxide is reduced to atomic germanium and solders the nickel plates together as non-melting soldering medium.

What is claimed is:

1. A method of bonding a semiconductor crystal to a metal element, comprising providing between and in contact with the semiconductor crystal and metal element a layer of germanium oxide, and heating the assembly in a hydrogen-containing reducing atmosphere and at a temperature above about 650° C. but below the melting point of the crystal and elemental germanium wherein the oxide is reduced and the resultant reduced material bonds the crystal and metal element firmly together in a uniformly penetrating alloyed bond.

2. A method as set forth in claim 1 wherein the crystal is of germanium.

3. A method as set forth in claim 2 wherein the metal element is lead.

4. A method as set forth in claim 2 wherein the metal element is nickel.

References Cited in the file of this patent

UNITED STATES PATENTS

| | | |
|---|---|---|
| 2,555,001 | Ohl | May 29, 1951 |
| 2,830,920 | Colson et al. | Apr. 15, 1958 |
| 2,964,839 | Marafioti et al. | Dec. 20, 1960 |
| 3,070,466 | Lyons | Dec. 25, 1962 |

FOREIGN PATENTS

| | | |
|---|---|---|
| 483,156 | Great Britain | Apr. 13, 1938 |